(12) United States Patent
Hassibi et al.

(10) Patent No.: US 6,877,148 B1
(45) Date of Patent: Apr. 5, 2005

(54) METHOD AND APPARATUS FOR ROUTING AN INTEGRATED CIRCUIT

(75) Inventors: Arash Hassibi, Mountain View, CA (US); Lungying Fong, Santa Clara, CA (US); Stephen Boyd, Stanford, CA (US)

(73) Assignee: Barcelona Design, Inc., Sunnyvale, CA (US)

( * ) Notice: Subject to any disclaimer, the term of this patent is extended or adjusted under 35 U.S.C. 154(b) by 0 days.

(21) Appl. No.: 10/118,673

(22) Filed: Apr. 7, 2002

(51) Int. Cl.[7] .............................................. G06F 17/50
(52) U.S. Cl. ............................. 716/13; 716/14; 716/15
(58) Field of Search ................................ 716/1, 2, 3, 4, 716/5, 6, 8, 9, 10, 11, 12, 13, 14, 15, 16

(56) References Cited

U.S. PATENT DOCUMENTS

| | | | |
|---|---|---|---|
| 4,918,614 A | | 4/1990 | Modarres et al. |
| 5,754,444 A | * | 5/1998 | Koford .......................... 716/9 |
| 6,182,272 B1 | | 1/2001 | Andreev et al. |
| 6,209,119 B1 | | 3/2001 | Fukui |
| 6,223,334 B1 | | 4/2001 | Suaris et al. |
| 6,247,167 B1 | * | 6/2001 | Raspopovic et al. .......... 716/13 |
| 6,269,277 B1 | | 7/2001 | Hershenson et al. |
| 6,272,668 B1 | | 8/2001 | Teene |
| 6,282,694 B1 | | 8/2001 | Cheng et al. |
| 6,295,633 B1 | | 9/2001 | Murakawa |
| 6,311,145 B1 | | 10/2001 | Hershenson et al. |
| 6,321,186 B1 | | 11/2001 | Yuan et al. |
| 6,353,918 B1 | * | 3/2002 | Carothers et al. .............. 716/8 |
| 6,496,966 B1 | * | 12/2002 | Barney et al. ................ 716/10 |
| 6,519,745 B1 | * | 2/2003 | Srinivas et al. ................ 716/5 |
| 6,532,582 B1 | * | 3/2003 | Zolotykh et al. ............. 716/11 |

OTHER PUBLICATIONS

Erwin Kreyszig, "Advanced Engineering Mathematics", Fifth Edition, John Wiley & Sons, Inc., 1983, Section 22.2, pp. 873–877.

Hershenson, Maria Del Mar, et al., "Optimization Of Inductor Circuits via Geometric Programming", Electrical Engineering Department, Stanford University, 54.3, pp. 994–998.

Mohan, Sunderarajan S. et al., "Bandwith Extension in CMOS with Optimized On–Chip Inductors", IEEE Journal of Solid State Circuits, vol. 35, No. 3, Mar. 2000, pp. 346–355.

(Continued)

Primary Examiner—Vuthe Siek
Assistant Examiner—Binh Tat
(74) Attorney, Agent, or Firm—Blakely, Sokoloff, Taylor & Zafman LLP

(57) ABSTRACT

In one embodiment, the invention is a method. The method is a method of routing a circuit having a set of nets and a set of circuit elements specified as a slicing tree and a set of linear constraints. The method includes finding short paths for the set of nets based on a minimum-spanning-tree solution to a floorplan derived from the slicing tree for each net of the set of nets. The method also includes routing the nets as conductors within channels of the floorplan, the conductors having locations satisfying a set of linear constraints based on the solution of a linear optimization problem.

12 Claims, 17 Drawing Sheets

OTHER PUBLICATIONS

Kim, Chung–Hwan, et al., "Frequency–Dependent in CMOS with Optimized On–Chip Inductors", IEEE Microwave and Guided Wave Letters, vol. 9, No. 12, Dec. 1999, pp. 514–516.

Maria Del Mar Hershenson, "CMOS Analog Circuit Design Via Geometric Programming", Dissertation submitted to the Department Of Electrical Engineering and The Committee On Graduate Studies, Stanford University, Stanford, California, Nov. 1999, Chapter 8, pp. 183–188. Revelent Section 8.2.4, first made available at the Stanford University Library on or about Nov. 17, 2000.

Hershenson, Maria Del Mar, et al., "Optimal Design Of CMOS OP–AMP via Geometric Programming", IEEE Transactions On Computer–Aided Design Of Integrated Circuits and Systems, Jan. 2001, IEEE vol. 20, No. 1., pp. 1–21, Paragraph '007A', Table 1.

Balsa, F., "Modeling Non–Slicing Floorplans With Binary Trees", 2000 IEEE/ACM, International Conference On Computer Aided Design. ICCAD–2000, Nov. 5, 2000, pp. 13–16.

* cited by examiner

US 6,877,148 B1

METHOD AND APPARATUS FOR ROUTING AN INTEGRATED CIRCUIT

BACKGROUND OF THE INVENTION

1. Field of the Invention

The invention generally relates to circuit design and more specifically relates to automated routing of integrated circuits.

2. Description of the Related Art

Integrated circuits have a long history of growing in complexity and scale. While laying out the first inverter or current mirror may not have presented challenges, integrated circuits have grown exponentially in terms of transistors and other circuit elements. With this growth in circuit elements has come similar growth in interconnection between circuit elements. Limited spatial resources available in integrated circuits have led to tradeoffs between circuit complexity and design time. At times, integrated circuits have been constrained due to overall size of wafers and defect densities, resulting in a practical limit on the number of transistors on an integrated circuit die, and a corresponding limit on design complexity. At other times, integrated circuits have been constrained by routing resources, resulting in fabrication processes using four or more layers of metal to route signal conductors for large and complex digital logic.

Analog circuit designers tend to face additional challenges when designing, placing and routing a circuit for fabrication as an integrated circuit. For example, analog circuits are notoriously sensitive to noise, whereas digital circuits tend to exhibit robust behavior in the face of noise. Analog circuits may be fabricated using a wide range of technologies and a wide range of fabrication factories, resulting in a myriad of options for design constraints arising out of the manufacturing process. For example, conductors in an integrated circuit are typically constrained by a minimum separation distance. Moreover, conductors of all types, but particularly some analog circuit conductors are subject to electromigration problems, thus requiring a minimum height and width to the conductors. The height of a conductor may be process dependent, such that only a minimum height may be specified, with an expectation that the actual height will be greater by an unpredictable amount or percentage. Thus, the width of the conductor may be constrained to be wider than might otherwise be desirable, to allow for conduction of high amperage currents.

Moreover, analog circuits operate as fast as current flows, typically without the benefit of a clock which allows for alignment of signals and margin for error in signal skew. Thus, when an analog circuit includes a differential pair of signals, skew between the signals (such as due to conductor differences or routing differences) may result in improper operation. An amplifier with two differential inputs having unreasonable skew may produce an unacceptable output (incorrect polarity and magnitude for example) due to comparison of two input signals which were skewed. Moreover, transition of the output to an acceptable output may be slow due to slew rate limitations imposed by power supply conductors in a circuit. As such, routing signals in an integrated circuit can be of great importance to the process of designing and fabricating an analog circuit. Long signal conductors will likely have a direct effect on the response time a circuit exhibits, mismatched signal conductors will likely result in unacceptable performance, and inefficient routing may result in overly large (and therefore costly) integrated circuits.

SUMMARY OF THE INVENTION

In one embodiment, the invention is a method. The method is a method of routing a circuit having a set of nets and a set of circuit elements specified as a slicing tree and a set of linear constraints. The method includes finding short paths for the set of nets based on a minimum-spanning-tree solution to a floorplan derived from the slicing tree for each net of the set of nets. The method also includes routing the nets as conductors within channels of the floorplan, the conductors having locations satisfying a set of linear constraints based on the solution of a linear optimization problem.

BRIEF DESCRIPTION OF THE DRAWINGS

The present invention is illustrated by way of example and not limitation in the accompanying figures.

DETAILED DESCRIPTION

Figure 1:
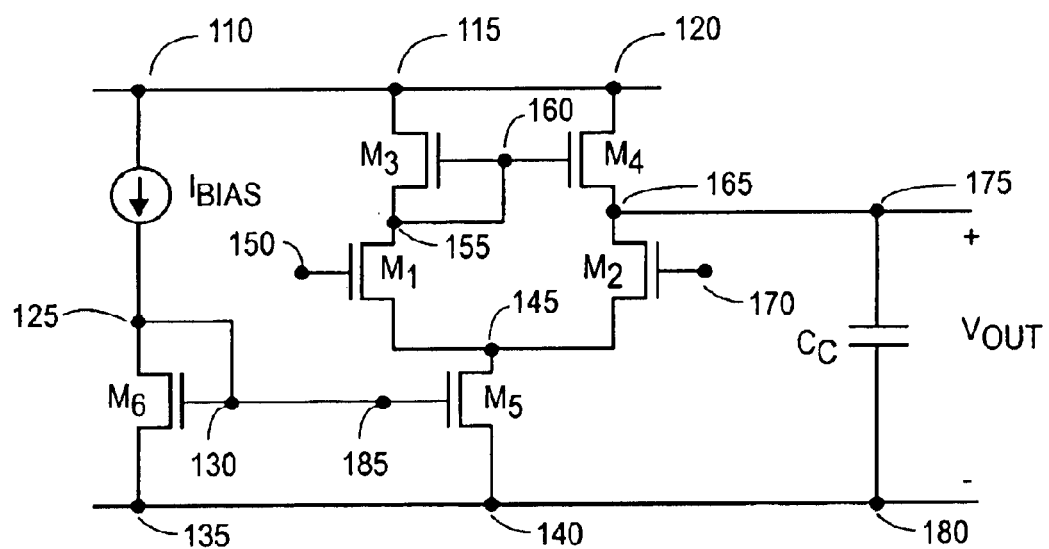
FIG. 1 illustrates a schematic of an integrated circuit which may be routed in one embodiment.

A method and apparatus for routing an integrated circuit is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

Introduction

Ideally, a circuit designer may specify for a program a circuit, and ask the program to provide something which a fabrication facility may use to create the circuit. For example, a circuit designer could specify an operational amplifier, having a specified gain, unity gain bandwidth, power, and circuit area (among other specifications) and the program could then determine what circuit elements to use, layout the circuit elements, route the conductors between the circuit elements, fine-tune the layout with the actual physical positions of the circuit elements and provide an output suitable for use by a fabrication facility. To do this, one needs a good router for the conductors, and that is what the present documents relates to.

In one embodiment, the invention is a method. The method is a method of routing a circuit having a set of nets and a set of (circuit elements specified as a slicing tree and a set of linear constraints. The method includes finding short paths for the set of nets based on a minimum-spanning-tree solution to a floorplan derived from the slicing tree for each net of the set of nets. The method also includes routing the nets as conductors within channels of the floorplan, the conductors having locations satisfying a set of linear constraints based on the solution of a linear optimization problem.

A routing program or router for an integrated circuit preferably exhibits a number of features. While exhibiting all of these features may not be possible, the present invention, in various embodiments, attempts to achieve this. One feature is that the router should be general and automatic, it should work across a wide variety of circuits and should not require human intervention. A second feature is that the router should always have a feasible solution, the router should not "hang" or take infinite time to complete a routing problem (providing the problem is initially solvable).

Third, the router should be fast and efficient, not only not taking an infinite amount of time to solve solvable problems, but also not taking an inordinate amount of time. Fourth, the router should be modular enough that it can be applied hierarchically, such as by using its previous output for two circuit elements in a process of knitting the two circuit elements together. Fifth, the router should produce high quality solutions to the routing problem, meaning reasonable routes which do not consume unreasonable resources and do obey design rules for a preferred process.

Sixth and finally, the router should enforce analog design constraints on the solution, such as locations of some signals (power/ground), electromigration constraints (typically thickness/width), symmetry of paired signals or signals of a bus, matching of sensitive nodes to other sensitive nodes and of sensitive conductors to other sensitive conductors, shielded signals routing between appropriate shield conductors (ground shielding for example) and avoidance of signals by routing away from selected signals.

In some embodiments, achieving these features is part of the design process for the router. For example, a router typically is designed to constrain signals to be routed such that no design rule violations are present. However, some tradeoffs may be made in designing the router. For example, signals in analog circuits may be routed in channels. Routing in channels allows for advantages such as reduced interference between signal conductors and active circuit elements, easy accessibility to conductors for debugging purposes, and predictability of the location of conductors (which can be hard to find when comparing a plot of a layout with a physical integrated circuit seen through a microscope).

Furthermore, constraints can be enforced as part of the process. For example, vertical and horizontal routes may be forced to be on different layers, thereby potentially reducing noise and crosstalk between vertical and horizontal conductors. Furthermore, conductors may be forced to obey minimum thickness or width requirements to allow for electromigration problems. Moreover, specified conductors may be confined to predefined areas, such as a Vdd bus located at the top of a chip and a Vss bus located at the bottom of the chip. Additionally, cells or circuit elements and pairs of conductors may be constrained to be symmetric about an axis of a chip, such as a vertical or horizontal axis. Also, parasitics of various pins of a circuit, or conductors may be matched and may also be constrained to a minimum (to inhibit unreasonably fast slew rates) or maximum (to inhibit unreasonably slow slew rates).

As examples, vertical and horizontal routes may be constrained to metal one and metal two layers of a process respectively. Conductors from power buses (and the buses themselves) may have electromigration requirements (constraints) specified, which may be translated into a required width based on design rule information for a targeted or preferred process. Transistors receiving inputs may be constrained to be symmetric about an axis, and conductors used to conduct the input signals may be similarly constrained. Similarly, conductors for signals to ground may be constrained to have matching parasitics (capacitance, inductance, resistance for example), preventing two devices from having different potentials relative to ground.

In the case of routing CMOS, snapping devices to appropriate power buses may also be useful. For example, snapping a PMOS device to a Vss bus may be useful, as most PMOS devices are connected directly to the Vss bus with at least one node, and that node typically effectively receives power (and thus current) for the device, and should not have too much resistance between it and Vss. Similarly, NMOS devices may be snapped to the Vdd bus for the same reasons.

With a slicing tree and/or a floorplan of an integrated circuit (representing the circuit in graph form), a process of finding shortest routes for nets and then routing the nets in corresponding channels may be used. The graph may be used, along with minimum-spanning-tree algorithms, to find the shortest paths within the graph. These paths will be good approximations of the optimally shortest routes in the physical circuit, and may be found in a reasonable amount of time using known graph-theoretic algorithms. By constraining the nets in various ways, conductors may be routed in channels within an integrated circuit, using linear programming to arrive at the coordinates for the conductors in question.

As circuits in integrated circuit form are currently representable as two-dimensional circuits (the depth of the circuit elements rarely affects general circuit performance), the circuits may be viewed as two-dimensional. In this case, the constraints mentioned are linear, as the top and bottom of a chip may be viewed as the lowest and highest values of y-coordinates (in the standard x-y coordinate system) for any location on the chip, respectively. Thus, snapping a PMOS device to a Vss bus may be written as a constraint such as:

YPMOS device>Yvss−maxdistance

Where maxdistance represents the maximum distance from the PMOS device to the Vss bus, YPMOS device represents the y-coordinate of the PMOS device (a corner of the device for example) and Yvss represents the y-coordinate of the Vss conductor (one edge of the conductor for example, or alternatively the center of the conductor).

A symmetry constraint may be written as:

Ydev1−Yaxis=Yaxis−Ydev2

Where a first component (dev1) and a second component (dev2) are to be symmetric about the y-axis of the device. Some matching constraints may be written as linear constraints, but they may also be handled after the rest of the routing occurs in other instances.

A circuit may thus be specified for a router as a series of regions containing circuit elements, a series of channels between the regions, the actual sizes (approximate or required) of the circuit elements (which may differ from the regions), and a series of pre-determined constraints. The regions and channels may be implicit from a slicing tree for a floorplan of an integrated circuit. The floorplan represents the general location of the circuit elements, prior to routing of conductors into channels. An exemplary list of constraints may appear as:

```
/*LAYOUT DIRECTIVES*/
   Net 1 M1.S, M2.S, M5.D;
   Net 2 M1.G, ext_pin;
   .
   .
   .
   Net15 M2.D, M3.S;
/*SYMMETRY*/
   (Net1, Net2) vertical symmetry
   (M1, M2) vertical symmetry
/*SHIELDING*/
   Net2 gnd shield
/*PARASITIC MATCHING*/
   (net1, net2) match
/*ELECTROMIGRATION*/
   net2 I=10 mA
```

As will be appreciated, other constraints may be included. Furthermore, each of the constraints above may be formulated as linear constraints with suitable massaging. The electromigration constraint requires information about the contemplated process, and the ground shield constraint may imply the existence of extra ground net(s) to shield the net in question, but translation into equations is trivial enough that the constraints may be parsed and translated automatically.

Note that the nets themselves are described as connecting to various pins (contact holes for example) of circuit elements, thus allowing for a determination of the locations that the nets must reach and thus which nodes of a graph of the circuit the minimum spanning tree for the net must reach. The circuit elements thus must be specified as having pins at set coordinates (which may move with the circuit element). Moreover, the circuit elements may have internal metal which is routed within the circuit element but which does not (or should not) affect the routing of the conductors in the channels.

Routing of the circuit may be viewed as a three phase process. At phase one, the nets are routed for a minimum route. At phase two, the locations of nets and circuit elements are adjusted using linear programming to find a feasible and near-optimal solution to the constraints on net and circuit element location. At phase three, compaction and design rule check adjustments occur, to provide a compact and DRC (design rule check) clean circuit layout.

An Exemplary Circuit

FIG. 1 illustrates a schematic of an integrated circuit which may be routed in one embodiment. The schematic is that of an operational amplifier using MOS transistors as components. As illustrated, all of the transistors are NMOS transistors, but it will be appreciated that PMOS transistors may be substituted into the circuit according to preferences of a designer and design constraints. The $I_{bias}$ element is a current source which is connected to node 110 and to node 125. Node 125 is also connected to transistor $M_6$ at both a drain node and a gate node. Transistor $M_6$ is also connected to node 135 at a source node, and node 130 at its gate node. Note that nodes 130 and 125 are thus connected together, whereas nodes 130 and 135 may be said to be coupled together, through their connections to transistor $M_6$. Node 185 is also connected to node 130, and node 185 is connected to the gate node of transistor $M_5$. Node 140 is connected to the source node of transistor $M_5$ and node 145 is connected to the drain node of transistor $M_5$. Transistor $M_5$, as connected in this circuit, operates as a current mirror, mirroring the current into the drain node of transistor $M_6$ at the drain node of transistor $M_5$. Note that each of nodes 135, 140 and 180 are connected to each other, and that in some embodiments, each of nodes 135, 140 and 180 are preferably connected to a circuit ground.

Transistors $M_1$ and $M_2$ are a differential pair of input transistors. The source node of transistors $M_1$ and $M_2$ are both connected to node 145. The gate node of transistor $M_1$ is connected to node 150, which serves as a first differential input to the circuit. The gate node of transistor $M_2$ is connected to node 170, which serves as a second differential input to the circuit. The drain node of transistor $M_1$ is connected to node 155, while the drain node of transistor $M_2$ is connected to node 165. Node 165 is also connected to the source node of transistor $M_4$, which has its gate node connected to node 160 and its drain node connected to node 120. Node 160 is also connected to the gate node of transistor $M_3$ and to node 155. Node 155, in turn, is also connected to the source node of transistor $M_3$, which also has a drain node connected to node 115.

Node 165 is connected to node 175, which serves as an output of the circuit. Node 175 is connected to a first node of coupling capacitor $C_c$, which has a second node connected to node 180. The output voltage of the circuit may be understood to be the voltage differential between node 175 and node 180, and is labeled as $V_{out}$. Also note that transistors $M_3$ and $M_4$ act as a load to transistors $M_1$ and $M_2$, allowing the inputs at nodes 150 and 170 to effectively steer current between the two branches ($M_1$–$M_3$ and $M_2$–$M_4$) to produce the output observed at node 175. In one embodiment, the output at node 175 may be expected to swing over a wide voltage range (nearly rail-to-rail) in response to a small range of voltage differential between nodes 150 and 170.

This relatively simple analog circuit serves as the basis for an illustration of routing of an analog circuit. As will be appreciated, circuit elements other than those illustrated may be utilized in various embodiments. For example, bipolar junction transistors or other forms of transistors may be used with or in place of MOS transistors. Moreover, other circuit elements such as resistors, spiral inductors, voltage sources, among other circuit elements may be used.

Figure 2A:
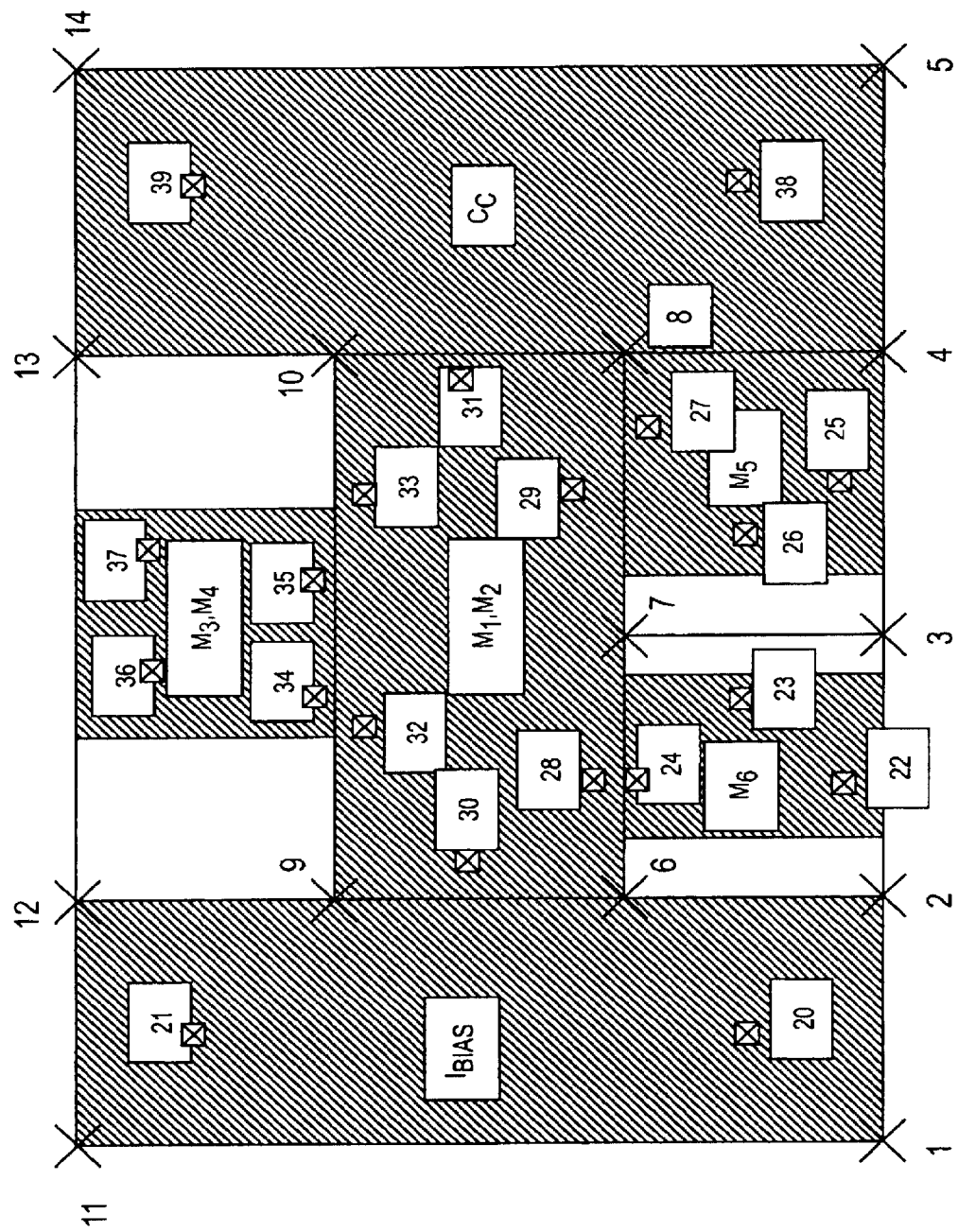
FIG. 2A illustrates an integrated circuit floorplan associated with the schematic of FIG. 1.
Figure 2B:
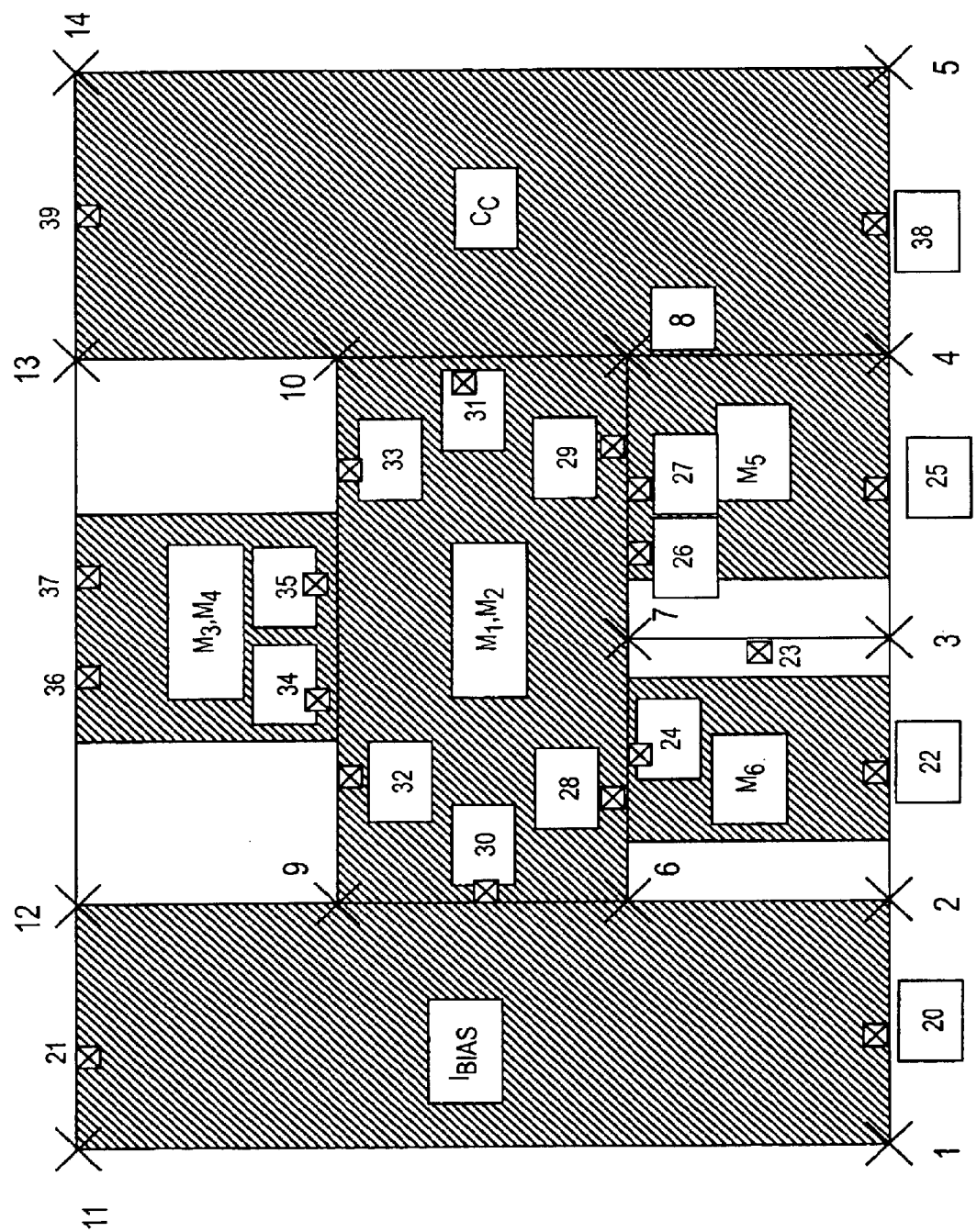
FIG. 2B illustrates an alternative integrated circuit floorplan associated with the schematic of FIG. 1.

FIG. 2B illustrates an integrated circuit floorplan associated with the schematic of FIG. 1. The integrated circuit floorplan illustrated provides a guide as to where on an integrated circuit a certain circuit element will be located. Thus, the coupling capacitor $C_c$ is illustrated on the right side, bounded by nodes 13, 14, 4 and 5. The coupling capacitor $C_c$ is illustrated as having two nodes or pins, 38 and 39, corresponding to the two nodes of the coupling capacitor $C_c$. Transistors $M_5$ and $M_6$ are located at the bottom of the floorplan, with $M_5$ bounded by nodes 3, 4, 7 and 8, and $M_6$ bounded by nodes 2, 3, 6 and 7. $M_5$ has three nodes or pins, labeled 25, 26 and 27, and corresponding to a source node, gate node and drain node respectively. Similarly, Me has three nodes or pins, labeled 22, 23 and 24, corresponding to a source node, gate node and drain node respectively.

$I_{bias}$ element is on the left side, and has two nodes, 21 and 20, corresponding to its inputs. $I_{bias}$ is bounded by nodes 1, 2, 11 and 12. At the top is the pair of transistors $M_3$ and $M_4$, which are collectively bounded by nodes 9, 10, 12 and 13. Because of the sensitive nature of the layout of transistors $M_3$ and $M_4$ (constraints on matching size, geometry, etc.), they are included in a single block in the floorplan. This single block has four nodes, 34, 35, 36, and 37, corresponding to the source of $M_3$, source of $M_4$, drain of $M_3$ and drain of $M_4$ respectively. Note that some connections are made internally, such as the connection between source and gate of $M_3$, or the connection between the gate of $M_3$ and the gate of $M_4$. In the center is the other pair of transistors, $M_1$ and $M_2$, bounded by nodes 6, 7, 8, 9 and 10. This pair of transistors includes nodes 28, 29, 30, 31, 32 and 33. Nodes 28, 30, and 32 correspond to the source, gate and drain nodes respectively of transistor $M_1$, while nodes 29, 31, and 33 correspond to the source, gate and drain nodes respectively of transistor $M_2$.

The floorplan, as illustrated, serves several purposes. It provides the guide to where on the integrated circuit a certain circuit element will be located, with each circuit element in a region specified by the boundary nodes and associated connectors. It provides a rough guide to the space utilized by the element. The actual space necessary for the element (again roughly) is illustrated by the hatched area occupied by the element, which is not usually co-extensive with the space available in the floorplan for the element. It also provides a graph of the channels available for routing signals (conductors) in the integrated circuit, with the nodes of the regions serving as vertices of the graph and the boundaries of the regions serving as connectors between the nodes. Associated coordinates for these nodes, and distances between the nodes measured in the coordinate-space provide a physical model to which the graph relates, with the distances related to the connectors (or paths) between the nodes. The physical model is the integrated circuit itself, so the coordinates and distances represent locations and distances on the integrated circuit to be fabricated.

As illustrated, the pins of the various circuit elements are snapped to the connectors located nearest to them. Thus, as illustrated, pin 24, for example, would be snapped to the connector between nodes 6 and 7, while pin 20 23, for example, would be snapped to the connector between nodes 3 and 7. In snapping the pins to the connectors, the pins are added as additional nodes to the graph, such that the connector between nodes 2 and 3 will be recreated as a connector between node 2 and 22 and another connector between node 22 and 3.

As the circuit elements in question may be moved around within their assigned regions, this snapping is an adequate surrogate for routing to the actual locations of the contact holes which are the physical manifestations of these pins. Thus, when the signals are to be routed within the channels, a minimum path for the signal may be found using well-known minimum-spanning-tree algorithms with the associated graph. The nodes of the graph may be thought of as street corners and the connectors or channels as the streets connecting the nodes. Each node (corner) has a pair of coordinates, and each channel (street) has a length. It will be appreciated that an alternate representation of the floorplan may be used, in which the pins are not snapped to connectors, as illustrated in FIG. 2A. However, this alternate representation may further complicate the process of routing signals and does not necessarily provide advantages over the representation of FIG. 2B.

Figure 3A:
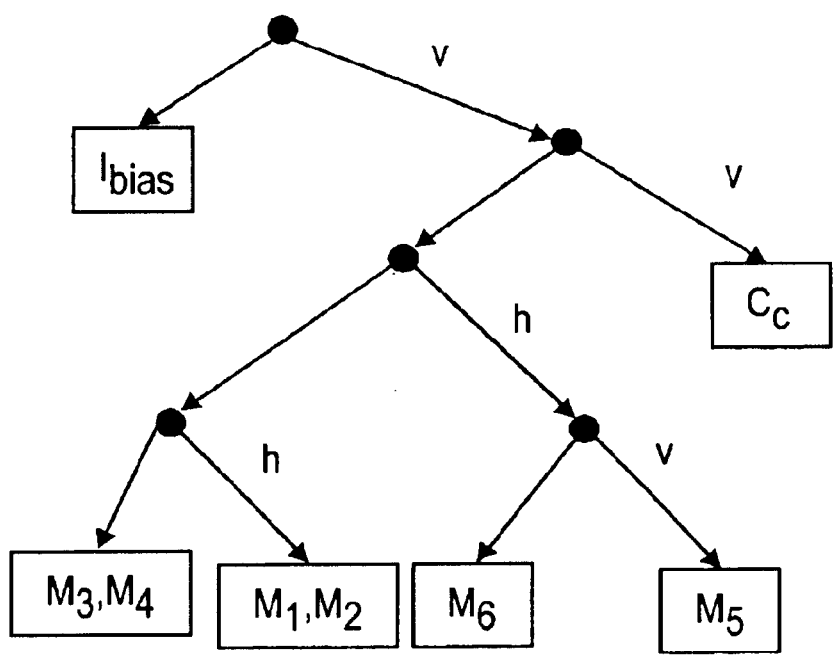
FIG. 3A illustrates a first slicing tree associated with the floorplan of FIG. 2.
Figure 3B:
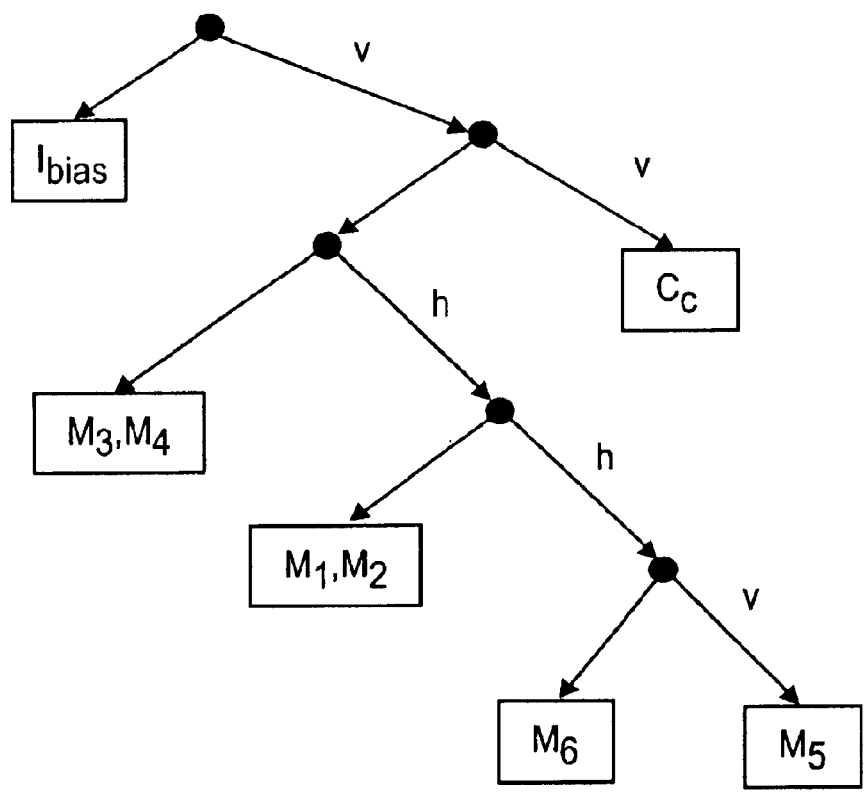
FIG. 3B illustrates a second slicing tree associated with the floorplan of FIG. 2.
Figure 3C:
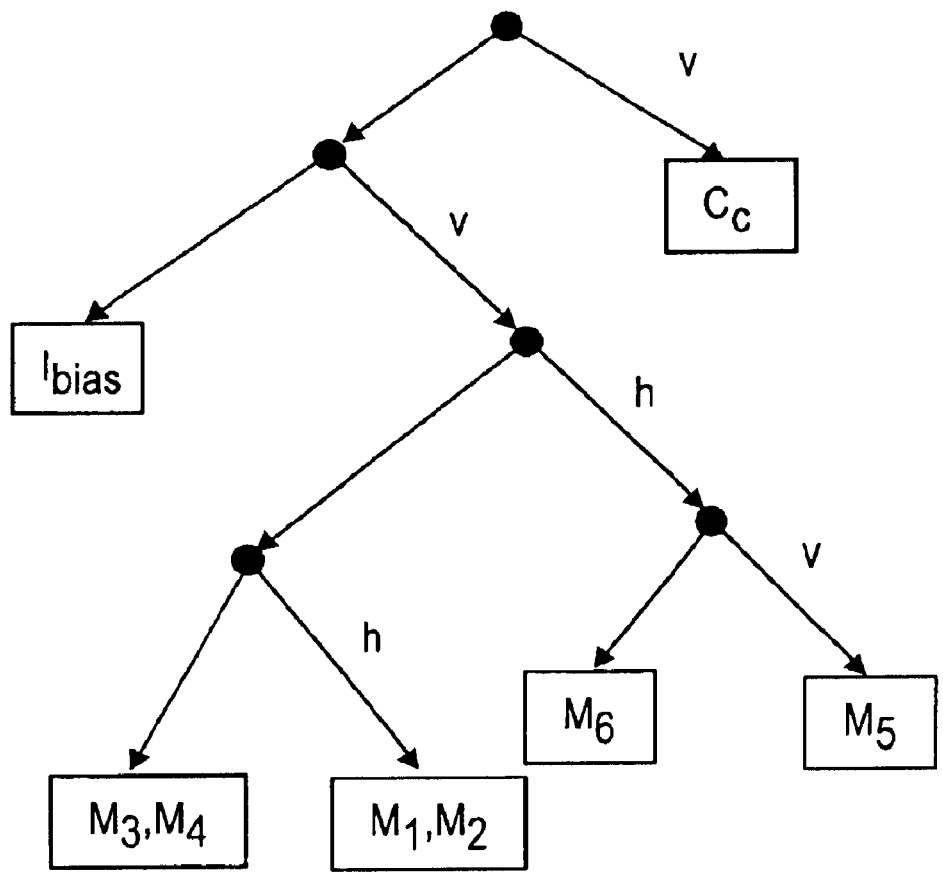
FIG. 3C illustrates a third slicing tree associated with the floorplan of FIG. 2.

FIG. 3A illustrates a first slicing tree associated with the floorplan of FIG. 2. FIG. 3B illustrates a second slicing tree associated with the floorplan of FIG. 2, and FIG. 3C illustrates a third slicing tree associated with the floorplan of FIG. 2. Each of the links labeled with an 'h' or 'v' represent a slice of a rectangular area. The exact representation may vary, but in one embodiment, the link may have associated with it a parameter such as a coordinate indicating where the slice occurs. The leaves of the tree are the circuit elements (such as the transistors or the coupling capacitor for example) and include, in one embodiment, parameters related to their actual size or footprint on the integrated circuit. Furthermore, in one embodiment, the root or topmost element includes a parameter relating to the size of the region prior to slicing of the region into the floorplan. Thus, the floorplan of FIG. 2 may be recreated using the slicing tree of FIG. 3A, or the slicing trees of either of FIGS. 3B or 3C.

As indicated, each of these slicing trees illustrates an alternative representation of the floorplan of FIG. 2. To recreate the floorplan of FIG. 2, using the slicing tree of FIG. 3B for example, one would first slice a region vertically into two regions, creating the $I_{bias}$ element. Next, one would slice the remaining region vertically again, creating the $C_c$ (coupling capacitor) element. Next, one would slice the remaining region horizontally, creating the two transistor element for $M_3$ and $M_4$. Next, one would slice the remaining region horizontally, creating the two transistor element for $M_1$ and $M_2$. Finally, one would slice the remaining region vertically, creating the regions for $M_5$ and $M_6$.

The slicing tree as used in the present document is a data structure representing the process described in the previous paragraph, in a more formal or general manner (and allowing for repetition of that process). As implemented in one embodiment, the slicing tree is a binary tree. However, it will be appreciated that a general tree (tree with an arbitrary number of branches from a node) may be used, and that for a particular choice of horizontal and vertical slices, there corresponds unique (general) tree representing that choice. As will be understood by those skilled in the art, a general tree can be converted to a binary tree in a number of different ways, hence the availability of various binary trees to represent a given floorplan. However, it will also be appreciated that the choice of slices for a floorplan (possibly realized or represented as a binary slicing tree similar to those of FIGS. 3A, 3B and 3C), may have an effect on the routing of the floorplan provided by the router, so a circuit designer may choose a particular binary slicing tree as input to the router for optimization purposes in some embodiments.

The Process

Figure 4:
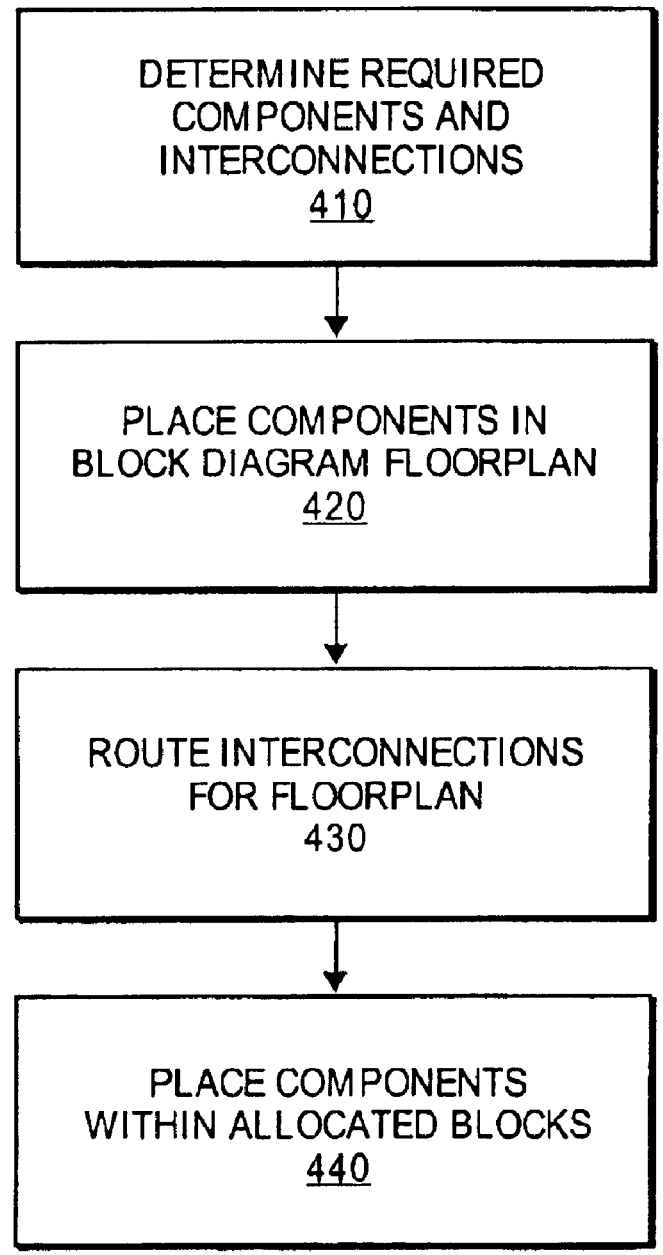
FIG. 4 presents a flow diagram illustrating an embodiment of placing and routing components of an integrated circuit.

FIG. 4 presents a flow diagram illustrating an embodiment of placing and routing components of an integrated circuit. At block 410, the required components of the circuit are determined, along with interconnections between those components. Note that this determination is made based on a combination of user input (a request for a circuit design) and a database of well-known circuit building blocks such as operational amplifiers, digital-analog and analog-digital converters, transistors, capacitors, current and voltage sources, and other building blocks along with information about processes at available fabrication facilities. At block 420, the components are placed into a floorplan in a block diagram form, such that the floorplan represents regions bounding a circuit element and the subregion occupied by the actual circuit element. The floorplan also includes channels between the regions for routing of conductors which connect the circuit elements. At block 430, the interconnections between the circuit elements are routed based on the floorplan. At block 440, the components are placed within the allocated regions or blocks, with further routing of conductors based on actual placement of components and variance from the representative floorplan. Block 430 represents what is described hereafter, while block 410, 420 and 440 are part of an overall system with which the present invention preferably works in some embodiments.

Figure 5:
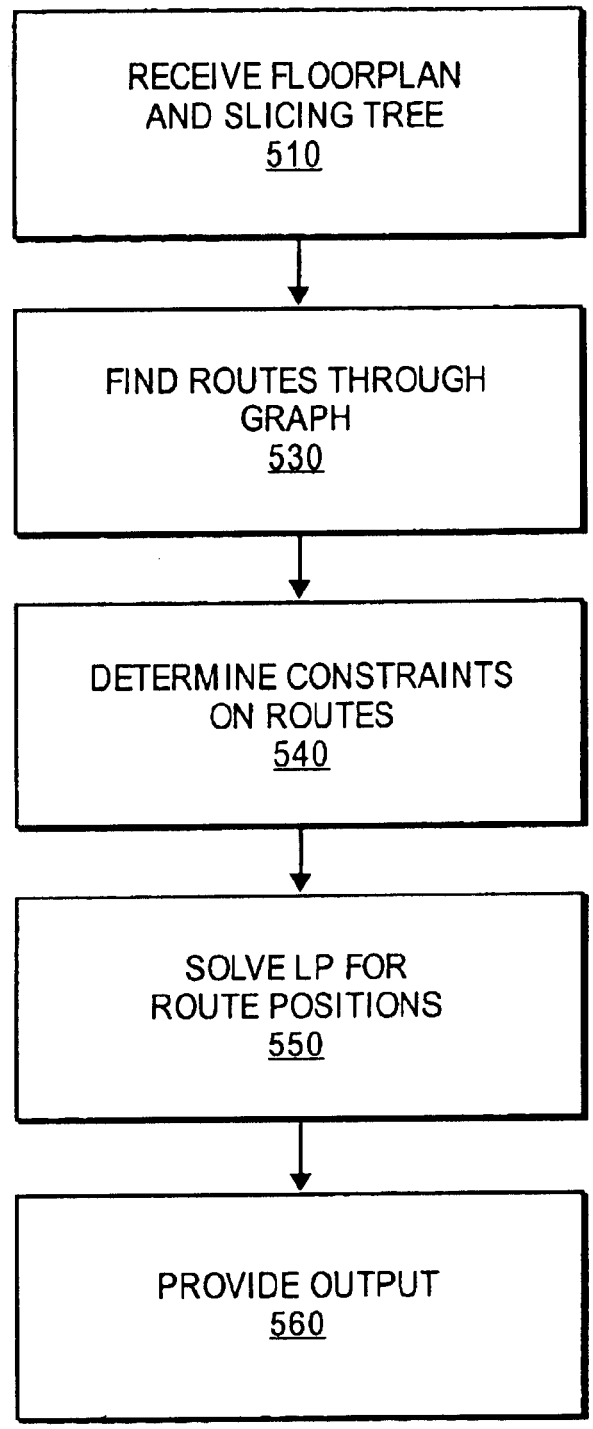
FIG. 5 presents a flow diagram illustrating an embodiment of a method of routing conductors of an integrated circuit.

FIG. 5 presents a flow diagram illustrating an embodiment of a method of routing conductors of an integrated circuit. At block 510, a slicing tree representing an integrated circuit is received. The slicing tree may be generated previously (not by the router), based on a floorplan, and effectively represents the floorplan. A graph of the floorplan may be generated from the slicing tree (along with information about pin locations of the circuit elements), and that graph may be referred to as the floorplan or a representation of the floorplan.

At block 530, routes through the graph associated with the floorplan are found for the conductors needed for the floorplan. At block 540, a determination is made as to what the constraints are on the routes of the conductors, such as constraints for design rules, constraints for matching routes of groups of conductors, constraints for symmetric routing of conductors, constraints for electromigration (size and density of conductors), and other potential constraints. At block 550, a linear programming algorithm is used to solve the equations representing these constraints, and thus to find a representation in coordinates for the location of every conductor in the channels of the floorplan. As will be appreciated and will be described more hereafter, blocks 540 and 550 may represent portions of an iterative process, which may be repeated several times to find a proper solution. At block 560, output is provided which includes the coordinates of the conductors, and may further include additional adjustments to conductors for parasitic matching.

Figure 6:
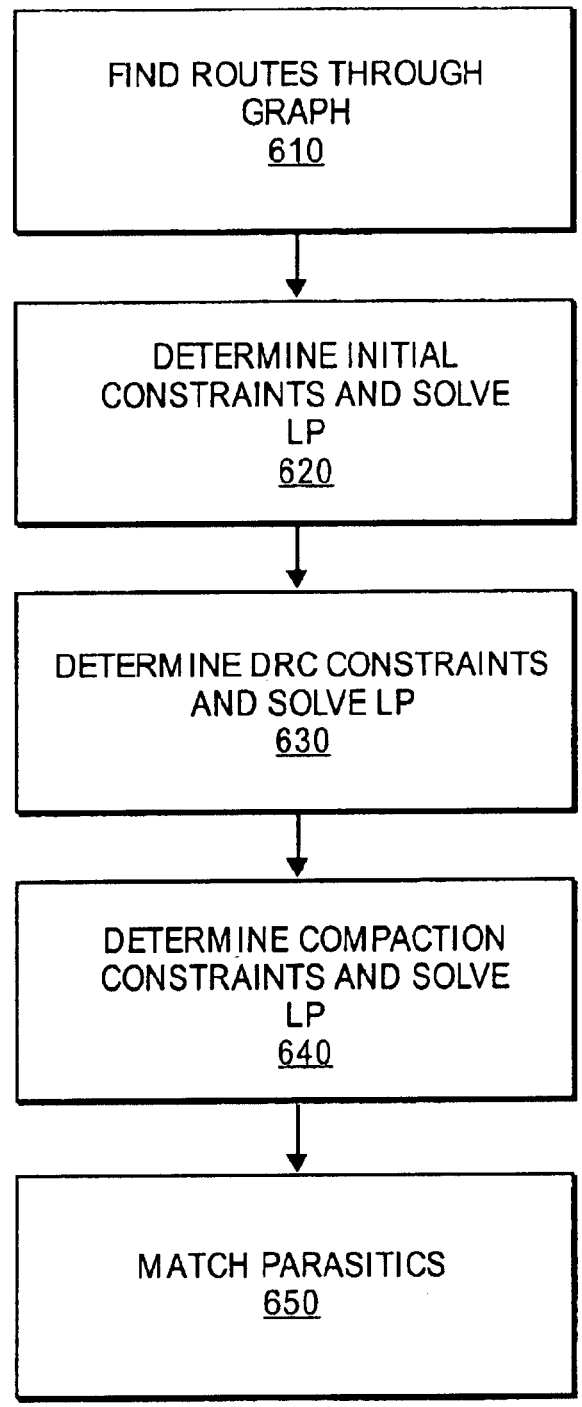
FIG. 6 presents a flow diagram illustrating an embodiment of a more detailed method of routing conductors of an integrated circuit.

FIG. 6 presents a flow diagram illustrating an embodiment of a more detailed method of routing conductors of an integrated circuit. At block 610, routes of conductors through a graph representing channels and pins on circuit elements in an integrated circuit are found, using a minimum-spanning-tree algorithm. At block 620, initial constraints on size and location of these conductors in the channels are found in the form of linear equalities arid inequalities, and linear programming techniques are used to solve the linear programming problem for the locations of the conductors.

At block 630, design rule check (DRC) constraints are found for the revised set of locations of conductors and represented as linear equalities and inequalities, and then linear programming techniques are used to solve for a second revised set of locations for conductors. At block 640, compaction constraints are found for the conductors as routed, and represented as linear equalities or inequalities, and the resulting set of constraints are solved using linear programming techniques to arrive at a revised set of locations for the conductors. At block 650, the conductors which are now free of DRC problems are altered for parasitic matching purposes, such as by adding tabs to equalize parasitic elements of matched conductors, and the coordinate representation of the conductors is then available for use in fabricating an integrated circuit, or for routing a more complex integrated circuit using this routed circuit as a subcircuit.

Figure 7:
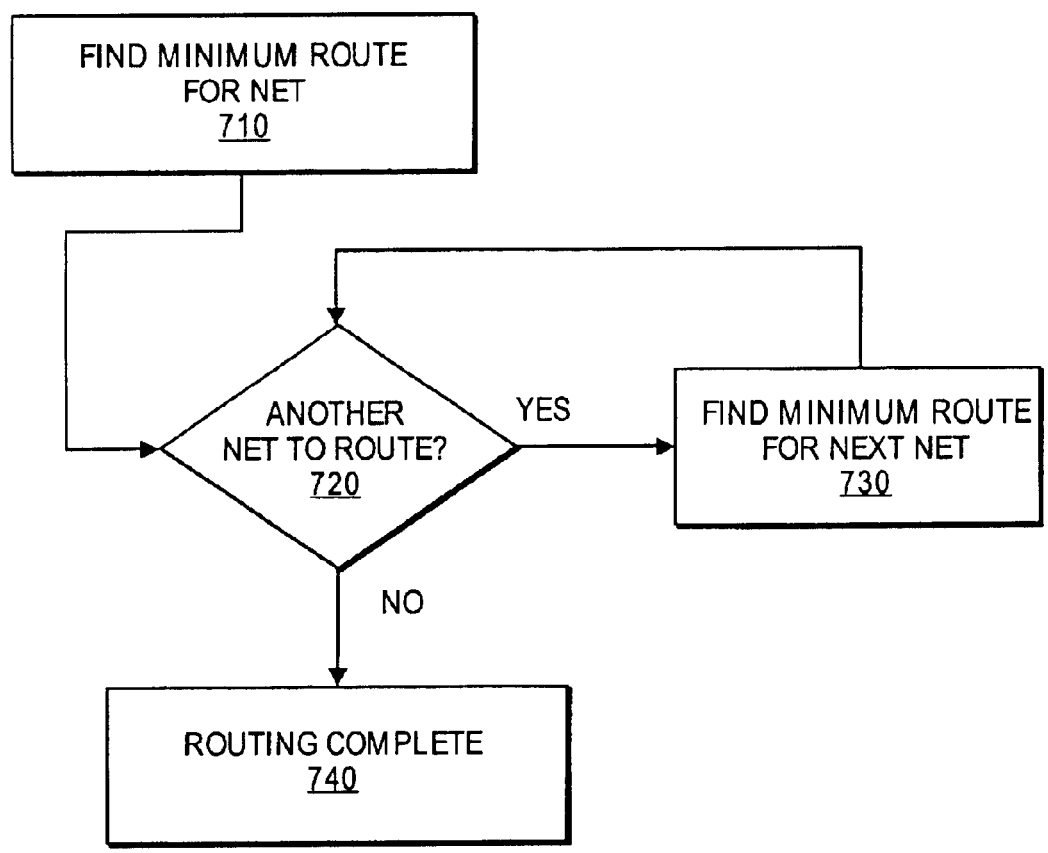
FIG. 7 presents a flow diagram illustrating an embodiment of a method of determining preferred routes for a set of nets.

FIG. 7 presents a flow diagram illustrating an embodiment of a method of determining preferred routes for a set of nets. At block 710, a minimum route for a first net of a circuit is found. Such routes may be found using minimum-spanning-tree algorithms which are well-known. The net in question is a conductor which connects a set of two or more nodes, and the minimum-spanning-tree problem is then cast as a problem of finding a minimum spanning tree for the set of nodes in the weighted graph representing the floorplan. At block 720, a determination is made as to whether another net needs to be routed, such as by determining if a list of unrouted nets has been exhausted. As a node may only be connected to one net, a list of nodes to be routed may be maintained rather than a list of nets, with nodes removed from the list when their associated net is routed.

At block 730, if a net still needs to be routed, it is routed in the same manner as described for block 710. The process then returns to block 720. If all nets have been routed (or all nodes have been routed), then the process proceeds to block 740, as the routing is complete. At this point, a specification of which channels of the floorplan a net should occupy is available as a result of the routing, and this specification can be expected to be useful as a near optimal solution in terms of net lengths based on the well-known minimum-spanning-tree algorithms used.

Figure 8:
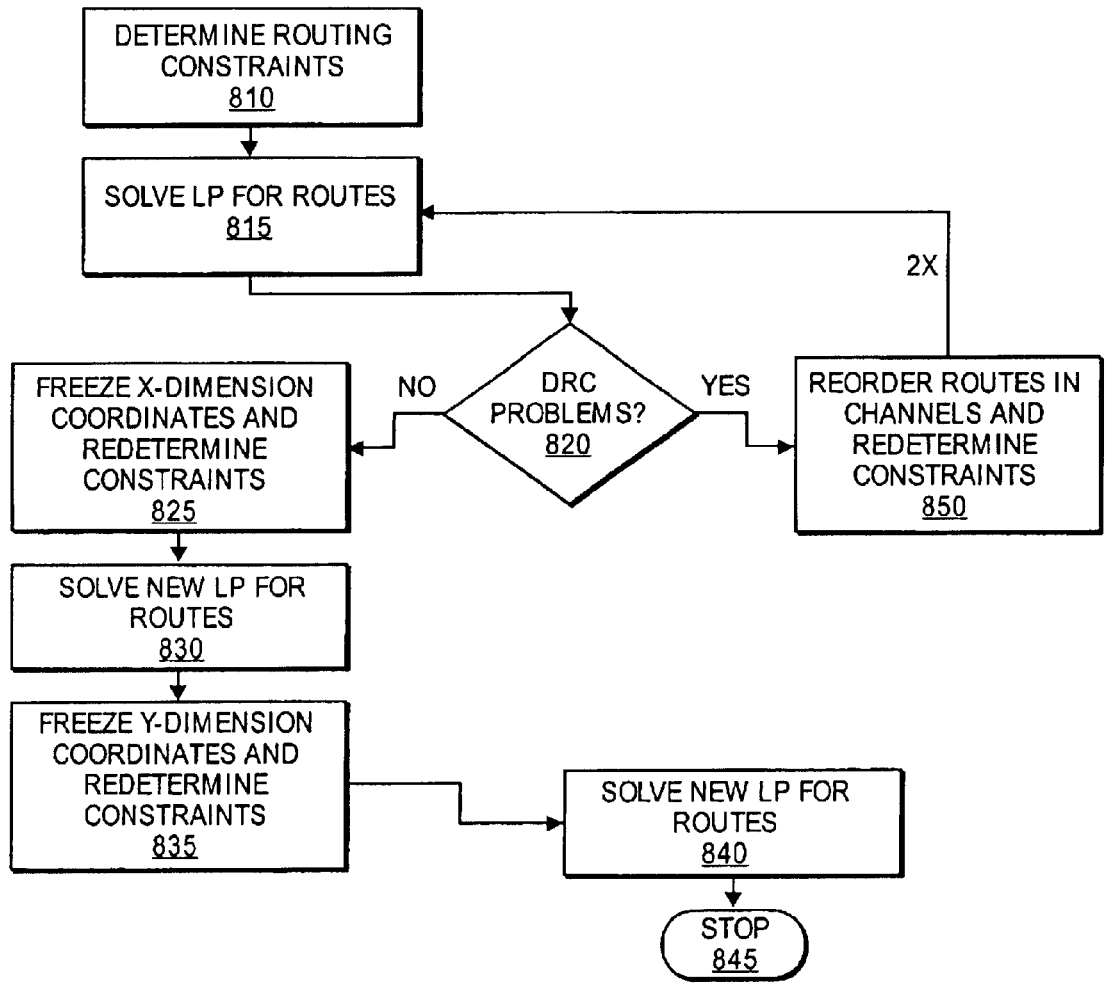
FIG. 8 presents a flow diagram illustrating an embodiment of a method of routing nets within channels.

FIG. 8 presents a flow diagram illustrating an embodiment of a method of routing nets within channels. At block 810, constraints on routing the nets are determined. Such constraints may be based-on a variety of factors, including design rules, matching of pairs or groups of nets, symmetric routing of pairs or groups of nets, electromigration requirements for nets, the location of the channel within the floorplan, matching of circuit elements, and alignment of circuit elements. These constraints are represented either as linear equalities or as linear inequalities. For example, a constraint on a net to be within a channel may appear as to inequalities:

Y$_{net}$<y$_{channeltop}$

Y$_{net}$>y$_{channelbottom}$

Moreover, nets are ordered within channels, so a constraint on a net may be:

Y$_{net}$>y$_{previousnet}$+minspacing

Similarly, a constraint on electromigration may be represented as:

Width$_{net}$>minwidth(constant or calculated)

Where minwidth is not a function so much as it is a constant which is either supplied for a given process based on design rules, or calculated for the individual net based on the design rules. Since all of these constraints may be represented as linear inequalities or equalities, the set of constraints results in a linear program. Moreover, constraints may affect the position of the circuit elements themselves, as there is some freedom to move these circuit elements within their allocated regions. Thus, channels may be widened or narrowed to ease congestion or eliminate wasted space resulting from a routing. When reference is made to producing a set of coordinates of conductors with respect to processes such as the process of FIG. 8, it should be understood that this may also result in production of coordinates for the circuit elements as represented in the floorplan. At block 815, the linear programming problem resulting from the constraints is solved using well-known algorithms, and a set of coordinates for the conductors of the circuit is produced.

At block 820, a determination is made as to whether there are design rule violations present within the design based on the lastest set of coordinates. If not, the process proceed to block 825, allowing for compaction and post processing. If design rule violations do exist, resolution of these violations is the next task. At block 850, selected route connections are reordered in their channels, and the set of constraints are updated. The exact heuristic is not necessairly determinative of the outcome, provided that a heuristic which tends to fix most DRC violations is used. The new LP problem is returned to block 815. The loop consists of blocks 815, 820 and 850 are repeated up to a fixed number of times to ensure acceptable runtime performance.

In one embodiment, the heuristic used to order nets in a channel chiefly consists of two rules. One, shorter nets are routed closer to the edge of the channels, and two, a net is routed closer to the side of the channel where it has more interconnections.

At block 825, the x-coordinates for the nets are frozen (replaced with constants for the subsequent linear program). This allows compaction in y-direction to occur, by redefining constraints without regard to the changes in the x-coordinates. In one embodiment, each pair of conductors is checked, to determine whether design rule constraints have an effect on their relative location. The only constraints included as part of the new linear program are those affecting the y-coordinte of the conductor in question. At block 830, the new linear programming problem is solved, resulting in a new set of y-coordinates for the conductors. In one embodiment, this has tended to result in compaction of area required for an integrated circuit on the order of 50%, when combined with the process 835 and 840.

At block 835, the y-coordinates of the nets are frozen, and compaction in the x-direction is allowed to occur. Again, each pair of conductors is checked, redefining constraints for their corresponding x-coordinates, while using constants for the y-coordinates. At block 840, the resulting linear programming problem is solved, leading to yet another new set of coordinates for the nets.

Finally, at block 845, the process terminates. As will be appreciated, this process may be altered in various ways, such as reordering the process blocks, incorporating additional contingencies, and emphasizing different rules or priorities for routing the nets. However, the spirit and scope of the invention includes such process variations. As described, the process may result in solving up to five separate linear programming problems. While this may seem to represent a huge computational investment, it also represents a bounded investment, as there is no opportunity in the presently illustrated process for an infinite loop of attempts at redefining constraints and re-solving the linear programming problem. This helps guarantee that the program does not "hang" or fail to return a useful result.

Figure 9:
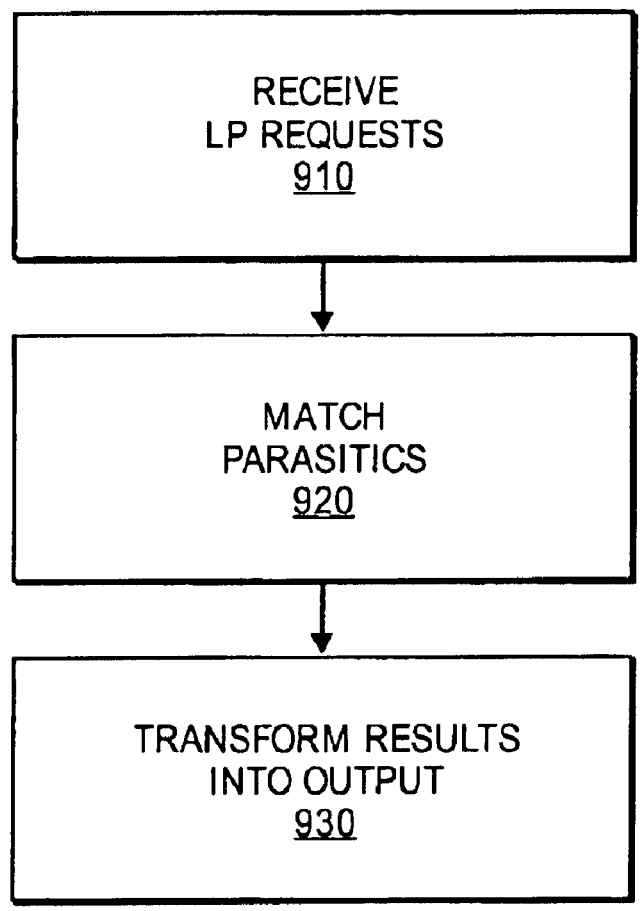
FIG. 9 presents a flow diagram illustrating an embodiment of a method of providing a routing output with matched parasitics for routed conductors.

FIG. 9 presents a flow diagram illustrating an embodiment of a method of providing a routing output with matched parasitics for routed conductors. At block 91 0, linear programming results including a set of coordinates for conductors is received. This set of coordinates may be the result of the operations described with respect to FIG. 8, for example. At block 920, parasitic matching is performed. Parasitic matching consists, in one embodiment, of checking nets for constraints requiring symmetry or similar constraints, and making sure that such nets have identical (or nearly identical) parasitic properties. If differences are apparent, such as one net having a shorter distance than the other net, tabs may be added to the shorter net in appropriate places (typically a corresponding segment of the net) such that the two nets now have the same or nearly the same characteristics.

The exact tolerance for errors in this area may be a user-defined, process-defined, or constant parameter. Moreover, it will be appreciated that the characteristics in question are simulated parameters, which designers cannot completely rely on for actual results during fabrication, due to real-world process variations. At block 930, the results of the linear programming solution and parasitic matching are transformed into a useful output, such as by storing in a file or by providing a pointer to the data structure holding the results in memory.

Figure 10:
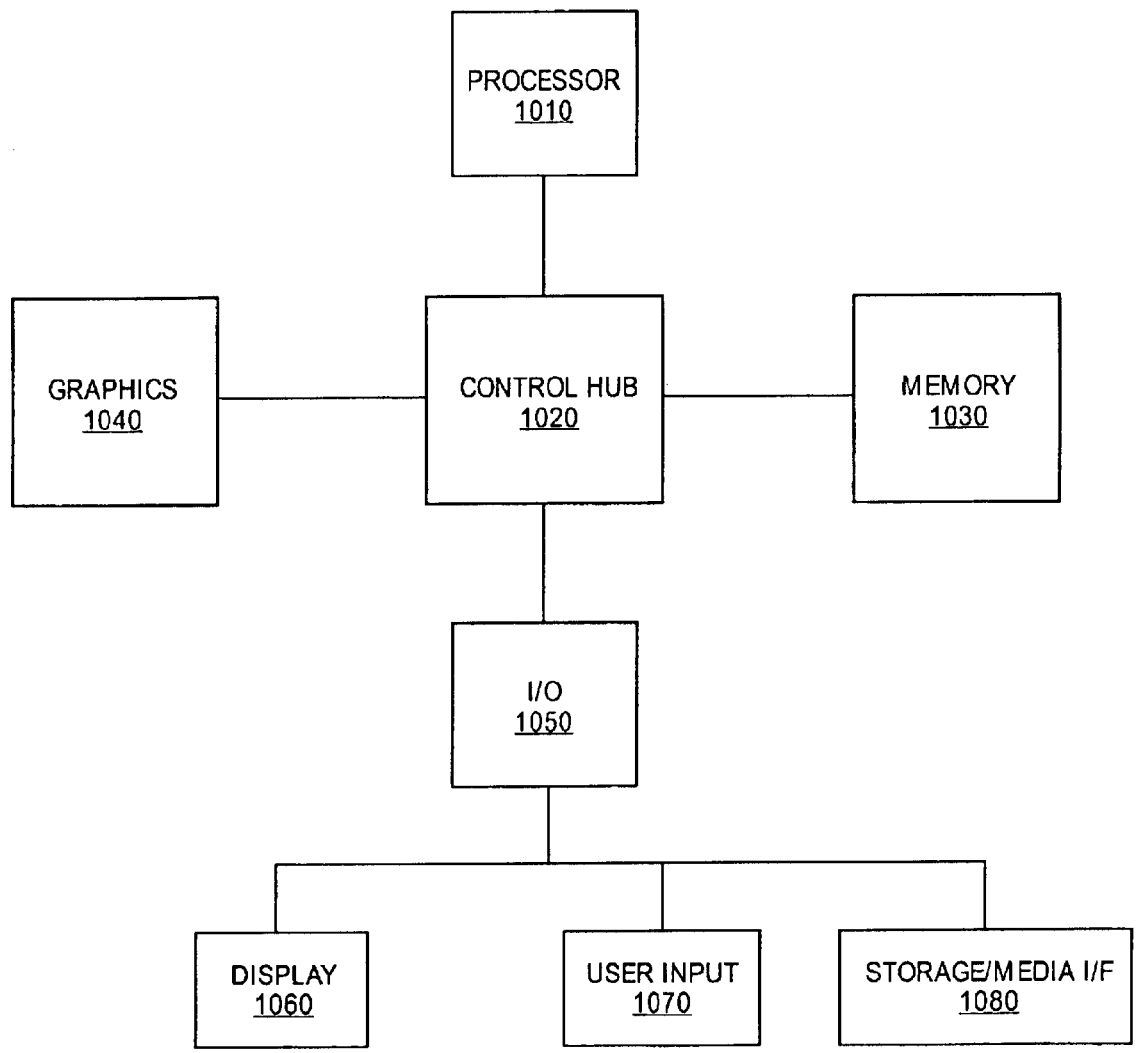
FIG. 10 illustrates an embodiment of a system.

FIG. 10 illustrates an embodiment of a system. Processor 1010 may execute instructions and cause actions to occur in the system. Control hub 1020 is coupled to processor 1010, and is also coupled to each of memory 1030, graphics control 1040, and I/O (input/output) hub 1050. I/O hub 1050 is also coupled to display 1060, user input 1070 (a keyboard or mouse for example) and storage or media interface 1080. Media interface 1080 may allow for access to a machine-readable medium, as defined elsewhere in this document. Processor 1010 may access instructions embodied or contained in memory 1030 or a medium (or media) accessible through storage and media interface 1080, and then execute those instructions. Execution of the instructions may then result in performance of actions by the system in accord with the instructions, generally resulting in physical results, such as manipulation of various physical properties of materials or devices, such as changes in memory state, printing or other display of results, or actions by devices coupled in some manner to the processor.

Figure 11:
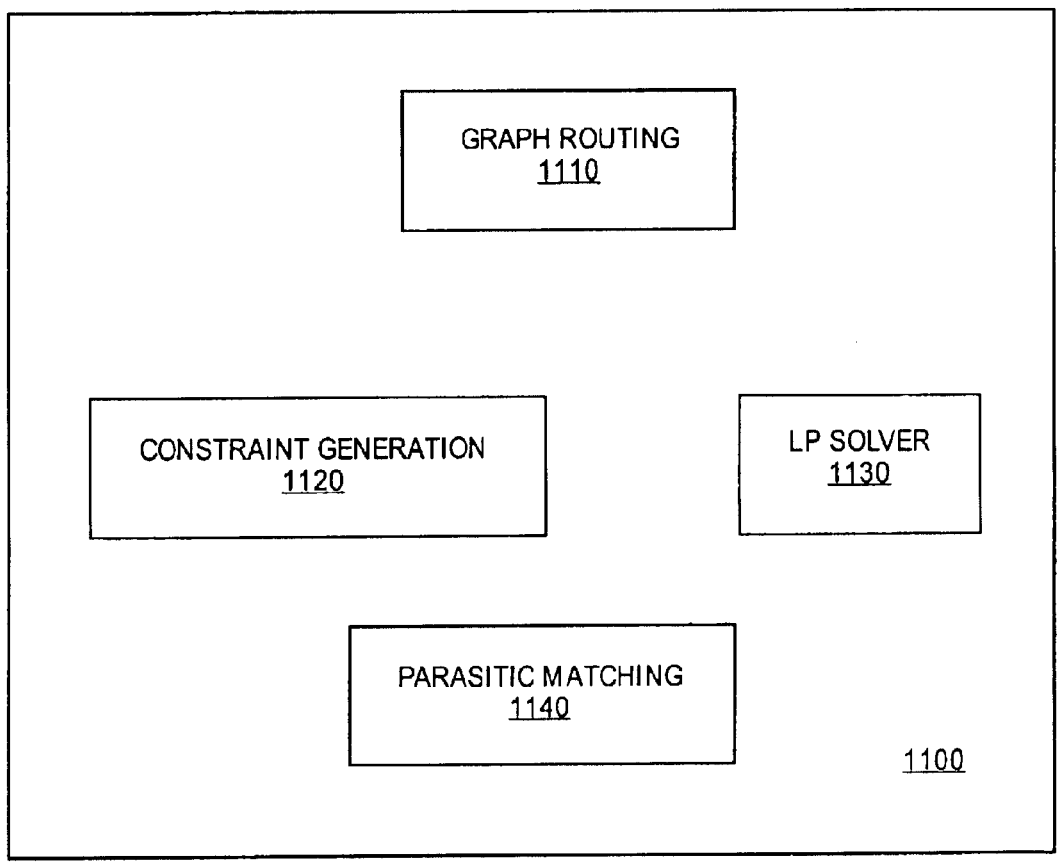
FIG. 11 illustrates an embodiment of a machine-readable medium which may embody instructions for execution by a processor.

FIG. 11 illustrates an embodiment of a machine-readable medium which may embody instructions for execution by a processor. Medium 1100 represents one medium or multiple media (either of the same medium or different media) which embody instructions for execution by a processor, and are machine-readable (allowing for retrieval of the instructions for use by the processor). Graph routing module 1110 is a module which utilizes a graph such as that described with respect to a floorplan, and executes a minimum-spanning-tree algorithm to find shortest paths for nets to be routed in channels.

Constraint generation module 1120 is a module which generates constraints represented by linear equations or linear inequalities based on a combination of design rules and routing directives provided as input (\for both conductors and circuit elements), design rules for a preferred process, and any other constraints included in the system either explicitly or inherently.

LP solver module 1130 is a module which utilizes the linear constraints of module 1120 and solves the resulting linear programming problem. Module 1130 will often be expected to solve the problem of minimizing the sum of all the lengths of all of the nets for the constraints, thus attempting to minimize the resources needed to produce the circuit in an integrated circuit form. Parasitic matching module 1140 is a module which uses the results of module 1130 (a solved linear programming problem resulting in a set of coordinates for conductors) in conjunction with constraints which affect parasitics such as symmetry requirements. Module 1140 adjusts conductors within design rules to attempt to match parasitic characteristics of these conductors with other conductors which are deemed to need identical characteristics for an optimal design.

Figure 12A:
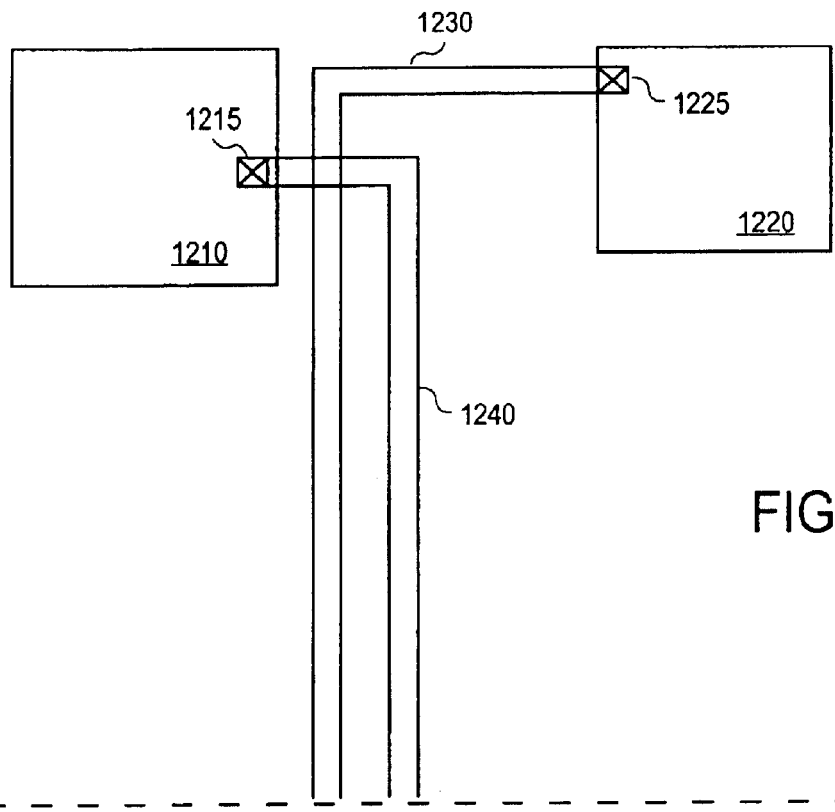
FIG. 12A illustrates a problematic routing of conductors.

FIG. 12A illustrates a problematic routing of conductors. Circuit element 1210 includes pin 1215, from which net 1240 is routed. Circuit element 1220 includes pin 1225 from which net 1230 is routed. In this example, the positions of the two horizontal conductors may result in a DRC violation. Moreover, the position of the two vertical conductors is definitely not optimal. Reordering the vertical conductors within their channel may result in a better routing for both conductors, and may eliminate the potential DRC violation.

Figure 12B:
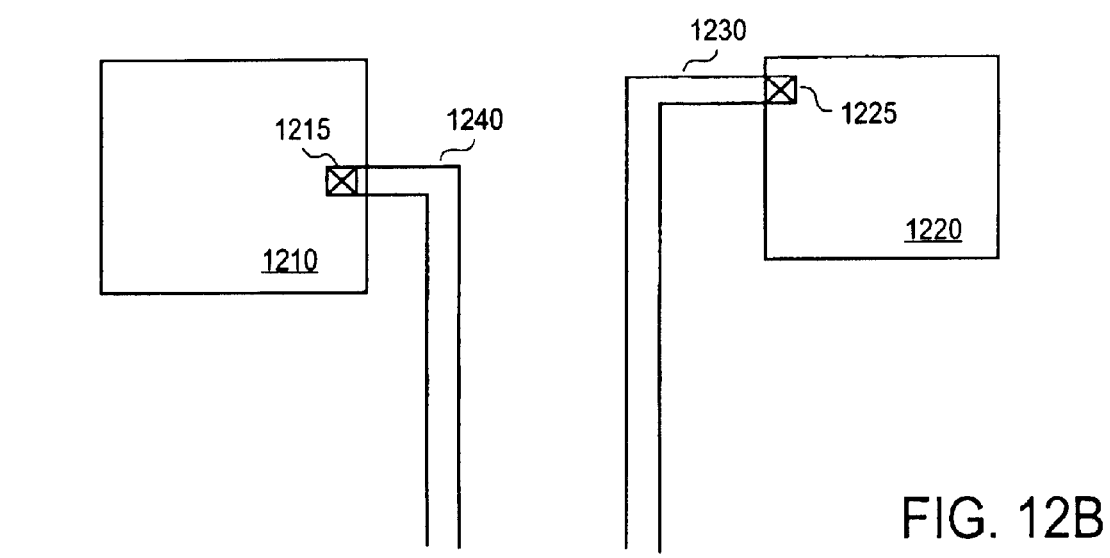
FIG. 12B illustrates a routing of conductors which may solve a problem of FIG. 12A.

FIG. 12B illustrates a routing of conductors which may solve a problem of FIG. 12A. Note that this reordering may result from either of the rules described above, relating to reordering to move longer nets to the middle of a channel and reordering to move nets with more connections to pins closer to the side of a channel. Furthermore, note that some situation may result in which application of these two rules would result in more DRC violations, but that the use of constraints on coordinates (here on the x-coordinates of the two vertical conductors) allows for influence on the routing of the conductors without forcing a DRC violation to satisfy a rule arbitrarily.

Figure 13:
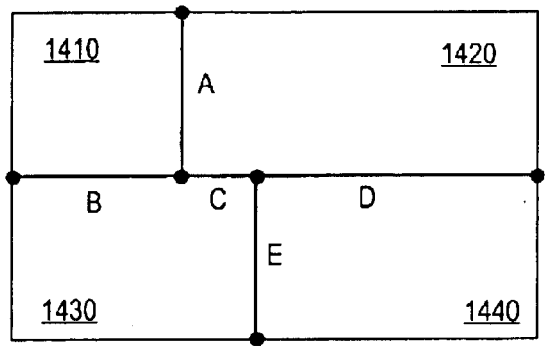
FIG. 13 illustrates an exemplary floorplan.
Figure 14A:
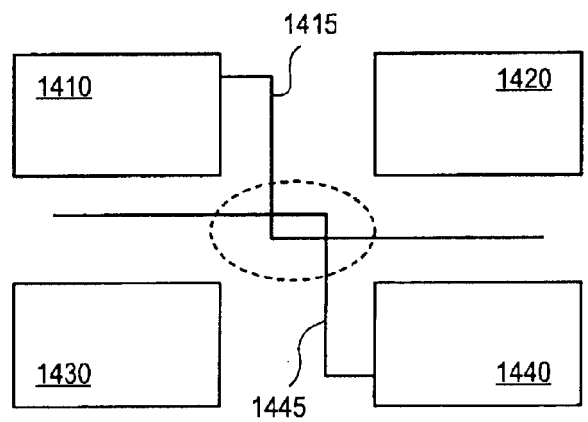
FIG. 14A illustrates a problematic routing of conductors based on the floorplan of FIG. 13.

FIG. 13 illustrates an exemplary floorplan. The floorplan includes four circuit elements (1410,1420, 1430, and 1440), and five channels (A, B, C, D, and E). FIG. 14A illustrates a problematic routing of conductors based on the floorplan of FIG. 13. A net 1415 from circuit element 1410 is routed such that it has a potential conflict with a net 1445 from circuit element 1440. The conflict occurs because the nets 1415 and 1445 are both routed in common horizontal channels (allowing for elimination of DRC problems with the horizontal legs), but different vertical channels (A and E). Channel A and Channel E are illustrated as completely separate in FIG. 13, but the allowance for narrowing or widening of channels and circuit element regions leads to potential conflicts such as these.

Figure 14B:
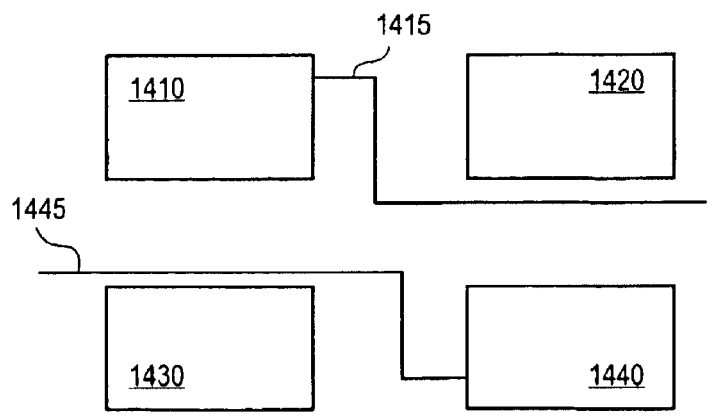
FIG. 14B illustrates a routing of conductors which may solve a problem of FIG. 14A.

FIG. 14B illustrates a routing of conductors which may solve a problem of FIG. 14A. The y-coordinates of the horizontal conductors of nets 1415 and 1445 are adjusted relative to the y-coordinates as illustrated in FIG. 14A. This adjustment may happen as a result of compaction, or as a result of the heuristics applied as described previously. Note that such an adjustment is not guaranteed by the two rules previously described for the heuristic, but a rule may be incorporated to attempt to resolve these types of situations. Furthermore, note that other changes may be appropriate. For example, during compaction, the x-coordinates of the vertical conductors may be adjusted to eliminate this conflict as a result of the comparison of each pair of nets.

Figure 15:
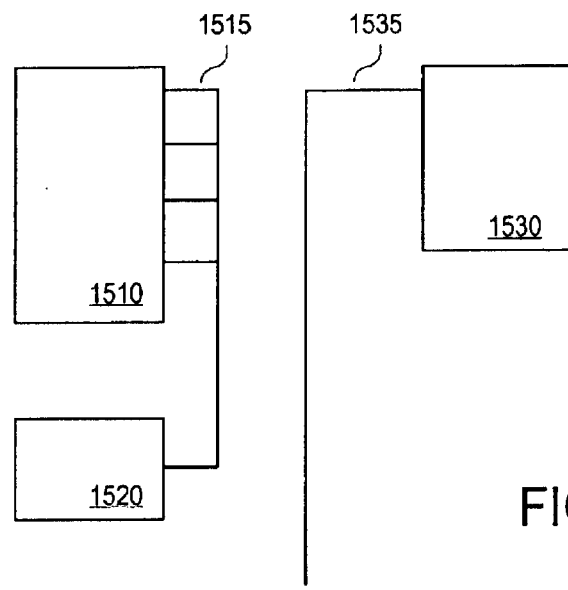
FIG. 15 illustrates another routing of conductors.

FIG. 15 illustrates the application of a heuristic to the routing of some conductors. Circuit elements 1510, 1520 and 1530 are illustrated, along with nets 1515 and 1535. Net 1515 has connections to several pins and is preferably routed close to the side of the channel based on the heuristics previously described. Net 1535 is a long net, and is preferably routed toward the middle of the channel based on the heuristic previously described.

Figures 16A, 16B:
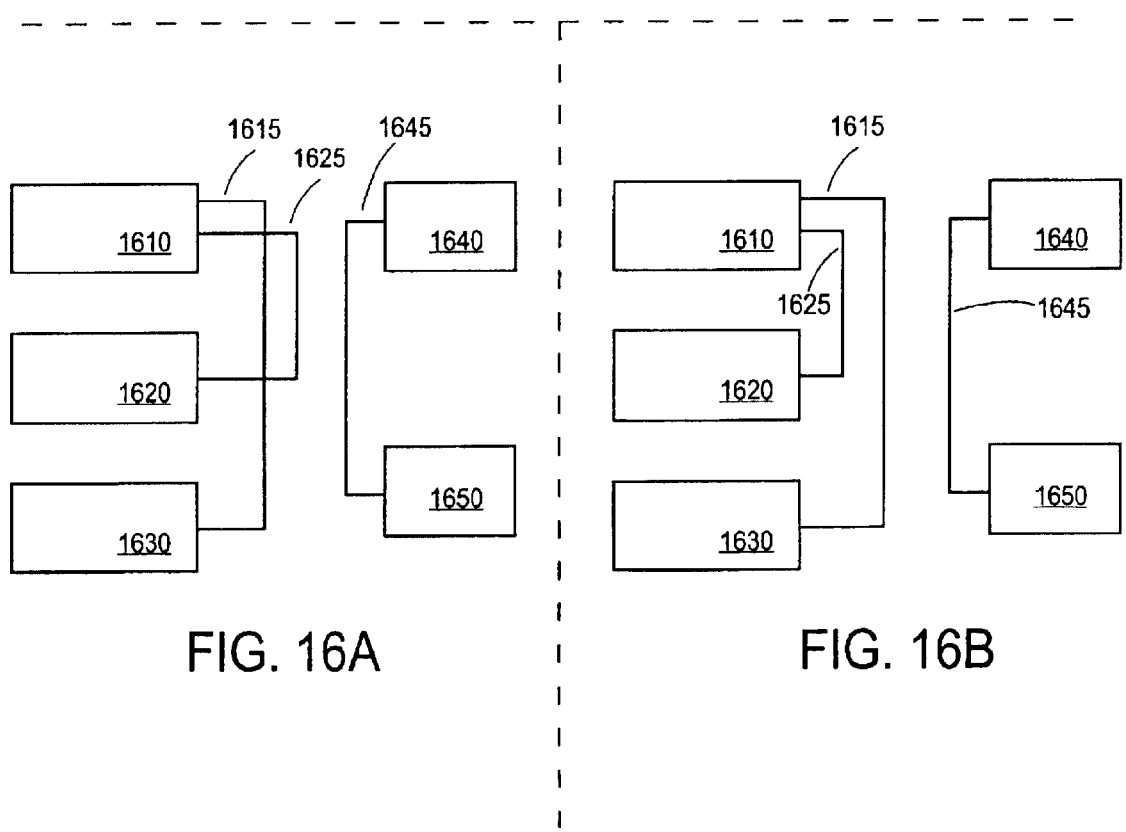
FIG. 16A illustrates another problematic routing of conductors.
FIG. 16B illustrates a routing of conductors which may solve a problem of FIG. 16A.

FIG. 16A illustrates another application of a heuristic to a problematic routing of conductors. Circuit elements 1610, 1620, 1630, 1640 and 1650 are illustrated along with nets 1615, 1625 and 1645. Net 1615 is a long net routed close to the side of a channel, net 1625 is a short net routed in the middle of the channel, and net 1645 is a long net routed close to the side of the channel. FIG. 16B illustrates a reordering of routes which resolves the problem of FIG. 16A. An adjustment is made (responsive to adjusted constraints), which causes net 1615 to be in the middle of the channel, net 1645 to nearly be in the middle of the channel, and net 1625 to be close to the left side of the channel.

Some portions of the detailed descriptions of this document are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data it-presented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions in either a persistent or a transitory manner, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

In the foregoing detailed description, the method and apparatus of the present invention has been described with reference to specific exemplary embodiments thereof. It will, however, be evident that various modifications and changes may be made thereto without departing from the broader spirit and scope of the present Invention. In particular, the separate blocks of the various block diagrams represent functional blocks of methods or apparatuses and are not necessarily indicative of physical or logical separations or of an order of operation inherent in the spirit and scope of the present invention. For example, the various blocks of FIG. 10 may be integrated into components, or may be subdivided into components. Similarly, the blocks of FIG. 6 or 8 (for example) represent portions of a method which, in some embodiments, may be reordered or may be organized in parallel rather than in a linear or step-wise fashion. The present specification and figures are accordingly to be regarded as illustrative rather than restrictive.

What is claimed is:

1. A method of routing a circuit having a set of nets and a set of circuit elements, the circuit specified with a slicing tree and a set of linear constraints, the method comprising:

finding paths for the set of nets using a minimum-spanning-tree algorithm applied to a floorplan for each net of the set of nets, the floorplan derived from the slicing tree;

routing the nets as conductors within channels of the floorplan, linear programming being used to ensure that the conductors have locations that satisfy the constraints of the set of linear constraints, the paths being used to influence the nets' routes and, using linear programming to re-route the conductors along a second coordinate axis, the linear programming used to re-route the conductors along a second coordinate axis having constraints that regard the conductors as being frozen at their coordinates along a first coordinate axis.

2. The method of claim 1 further comprising:

using linear programming to re-route the conductors along the first coordinate axis, the linear programming used to re-route the conductors along the first coordinate axis having constraints that regard the conductors as being frozen at their coordinates for the second coordinate axis.

3. The method of claim 2 further comprising:

re-routing the conductors using linear programming with a modified set of constraints, the modified set of constraints relating to DRC violations resulting from the routing of the conductors, the modified set of constraints derived from the set of linear constraints.

4. The method of claim 3 further comprising:

altering coordinates of the conductors to satisfy parasitic matching requirements of the nets.

5. A machine-readable medium embodying instructions which, when executed by a processor, cause the processor to perform a method of routing a circuit having a set of nets and a set of circuit elements, the circuit specified with a slicing tree and a set of linear constraints, the method comprising:

finding paths for the set of nets using a minimum-spanning-tree algorithm applied to a floorplan for each net of the set of nets, the floorplan derived from the slicing tree;

routing the nets as conductors within channels of the floorplan, linear programming being used to ensure that the conductors have locations that satisfy the constraints of the set of linear constraints, the paths being used to influence the nets' routes; and, using linear programming to re-route the conductors along a second coordinate axis, the linear programming used to re-route the conductors along a second coordinate axis having constraints that regard the conductors as being frozen at their coordinates along a first coordinate axis.

6. The machine-readable medium of claim 5 wherein the method further comprises:

using linear programming to re-route the conductors along the first coordinate axis, the linear programming used to re-route the conductors along the first coordinate axis having constraints that regard the conductors as being frozen at their coordinates for the second coordinate axis.

7. The machine-readable medium of claim 6 wherein the method further comprises:

re-routing the conductors using linear programming with a modified set of constraints, the modified set of constraints relating to DRC violations resulting from the routing of the conductors, the modified set of constraints derived from the set of linear constraints.

8. The machine-readable medium of claim 7 wherein the method further comprises:

altering coordinates of the conductors to satisfy parasitic matching requirements of the nets.

9. A system comprising:

a processor;

a control hub coupled to the processor;

an i/o hub coupled to the control hub;

computer readable media at least including memory coupled to the control hub;

a medium interface coupled to the i/o hub;

wherein the processor is to execute instructions retrieved from the machine readable medium to determine a circuit's routing, the circuit having a set of nets and a set of circuit elements, the circuit specified with a slicing tree and a set of linear constraints, the processor to execute the instructions:

to find paths for the set of nets on using a minimum-spanning-tree solution algorithm applied to a floorplan for each net of the set of nets, the floorplan derived from the slicing tree, to route the nets as conductors within channels of the floorplan, linear programming being used to ensure that the conductors have locations that satisfy the constraints of the set of linear constraints, the paths being used to influence the nets' routes, and, to use linear programming to re-route the conductors along a second coordinate axis, the linear programming used to re-route the conductors along a second coordinate axis having constraints that regard the conductors as being frozen at their coordinates along a first coordinate axis.

10. The system of claim 9 wherein the processor is further to use linear programming to re-route the conductors along the first coordinate axis, the linear programming used to re-route the conductors along the first coordinate axis having constraints that regard the conductors as being frozen at their coordinates for the second coordinate axis.

11. The system of claim 10 wherein the processor is further to re-route the conductors using linear programming with a modified set of constraints, the modified set of constraints relating to DRC violations resulting from the routing of the conductors, the modified set of constraints derived from the set of linear constraints.

12. The system of claim 11 wherein the processor is further to alter coordinates of the conductors to satisfy parasitic matching requirements of the nets.

* * * * *